US008050055B2

(12) United States Patent
Monda et al.

(10) Patent No.: US 8,050,055 B2
(45) Date of Patent: Nov. 1, 2011

(54) ELECTRONIC APPARATUS

(75) Inventors: Tomoko Monda, Yokohama (JP); Minoru Mukai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 496 days.

(21) Appl. No.: 12/355,125

(22) Filed: Jan. 16, 2009

(65) Prior Publication Data

US 2009/0190317 A1 Jul. 30, 2009

(30) Foreign Application Priority Data

Jan. 16, 2008 (JP) ................................ P2008-006867

(51) Int. Cl.
*H05K 5/00* (2006.01)
(52) U.S. Cl. ........................................ 361/807; 361/759
(58) Field of Classification Search .................. 361/759, 361/742, 758, 770, 804, 807; 174/138 E, 174/138 G
See application file for complete search history.

(56) References Cited

U.S. PATENT DOCUMENTS

| | | | | |
|---|---|---|---|---|
| 4,286,837 A | * | 9/1981 | Yasutake et al. | 439/637 |
| 5,083,052 A | * | 1/1992 | Ochi | 310/64 |
| 6,804,124 B2 | * | 10/2004 | Takahashi | 361/798 |
| 7,206,109 B2 | * | 4/2007 | Hayakawa et al. | 359/213.1 |
| 7,515,403 B2 | * | 4/2009 | Hong | 361/679.22 |
| 7,567,441 B2 | * | 7/2009 | Monda et al. | 361/752 |
| 7,710,728 B2 | * | 5/2010 | Arisaka et al. | 361/719 |
| 7,852,638 B2 | * | 12/2010 | Kondo et al. | 361/829 |
| 2005/0052827 A1 | * | 3/2005 | Kim | 361/638 |
| 2006/0077642 A1 | * | 4/2006 | Estes et al. | 361/752 |
| 2008/0101200 A1 | | 5/2008 | Sato | |
| 2008/0310130 A1 | * | 12/2008 | Monda et al. | 361/752 |
| 2009/0295325 A1 | * | 12/2009 | Sekine et al. | 318/646 |

FOREIGN PATENT DOCUMENTS

| | | | |
|---|---|---|---|
| JP | 09-008488 | | 1/1997 |
| JP | 10-093297 | | 4/1998 |
| JP | 2001-007550 | | 1/2001 |
| JP | 2008078241 A | * | 4/2008 |
| JP | 2008277513 A | * | 11/2008 |
| JP | 2008309528 A | * | 12/2008 |
| JP | 2009170647 A | * | 7/2009 |

* cited by examiner

*Primary Examiner* — Lisa Lea Edmonds
(74) *Attorney, Agent, or Firm* — Turocy & Watson, LLP

(57) ABSTRACT

According to one aspect of the invention, there is provided an electronic apparatus having a circuit board supporting structure, the circuit board supporting structure including: a casing including a first body and a second body, the first body having a first boss portion, the second body having a second boss portion; a jig including a cylindrical portion having, and a flange portion formed on an outer periphery, the cylindrical portion configured to slidably receive the first boss portion and the second boss portion in an inner peripheral wall; and a circuit board disposed in the casing. The first and second boss portions are configured to be fastened by a bolt member; the circuit board has a hole and a joining region provided around the hole, the hole configured to allow the cylindrical portion to penetrate therethrough; and the joining region is configured to be soldered to the flange portion.

9 Claims, 8 Drawing Sheets

ELECTRONIC APPARATUS

The entire disclosure of Japanese Patent Application No. 2008-006867 filed on Jan. 16, 2008, including specification, claims, drawings and abstract is incorporated herein by reference in its entirety.

BACKGROUND

1. Field of the Invention

One aspect of the present invention relates to a casing of an electronic apparatus with improved reliability of joints, and a supporting structure of a circuit board on which electronic components are mounted.

2. Description of the Related Art

With sophistication, multi-functionalization, etc., of instruments mounted with electronic apparatuses, the number of electrical joints which joins a circuit board and an electronic apparatus becomes an extremely large number. As a result, ensuring of joint reliability is not easy.

In electronic apparatuses, there is a tendency that thermal stress resulting from a difference between coefficients of linear expansion of a casing and a circuit board, and stress resulting from external load become large especially around a boss portion. Therefore, when the circuit board is fastened and fixed to the casing via the boss portion, the load of electronic components on the circuit board in a vicinity of the boss portion increases. Especially, more large-sized electronic components are there in the vicinity of a middle of the circuit board. This problem is actualized. Hereinafter, a cause of deterioration of reliability of a joint will be specifically described with reference to FIG. 13. A circuit board 13 is fixed to casing boss portions 27, 28, and 29. When the circuit board 13, the upper casing 11, and the lower casing 12 are fixed at the boss portions 27, 28, and 29, and the stress of the circuit board 13 around the boss portions 27 and 28 by temperature fluctuation and the 29 becomes large due to the difference between the coefficients of linear expansion of the circuit board 13, and the upper casing 11 or the lower casing 12.

Also, in a case where external load is generated, since deformation of the upper casing 11 and the lower casing 12 is transmitted to the circuit board via the boss portions 27, 28, and 29, the stress of the circuit board 13 around the boss portions 27 and 28 and the 29 becomes large. In particular, the tendency that the load of electronic components 19 in the vicinity of the boss portion 27 increases is observed in the middle of the circuit board 13.

A method of fastening a shielding plate and a boss portion of a casing is suggested in connection with a circuit board (see JP-A-9-8488 (FIG. 2), for instance).

This method is a method of arranging a solder pattern, and jointly fastening the circuit board having a solder portion formed thereon and the shielding plate to the boss portion of the casing while the solder portion is interposed therebetween.

In the invention disclosed in JP-A-9-8488, the circuit board is soldered to the casing, and electrical connection is secured. Thus, thermal stress can be reduced. However, the concentration of stress caused around an attaching portion by external load onto an electronic component mounted on the circuit board cannot be reduced.

SUMMARY

According to one aspect of the invention, there is provided an electronic apparatus having a circuit board supporting structure, the circuit board supporting structure including: a casing including a first body and a second body, the first body having a first boss portion, the second body having a second boss portion; a jig including a cylindrical portion having an inner peripheral wall of the cylindrical portion, and a flange portion formed on an outer periphery, the cylindrical portion configured to slidably receive the first boss portion and the second boss portion in the inner peripheral wall; and a circuit board disposed in the casing, wherein: the first boss portion and the second boss portion are configured to be fastened by a bolt member; the circuit board has a hole and a joining region provided around the hole, the hole configured to allow the cylindrical portion to penetrate therethrough; and the joining region is configured to be soldered to the flange portion.

BRIEF DESCRIPTION OF THE DRAWINGS

Embodiment may be described in detail with reference to the accompanying drawings, in which.

DETAILED DESCRIPTION OF THE EMBODIMENTS

Figure 1:
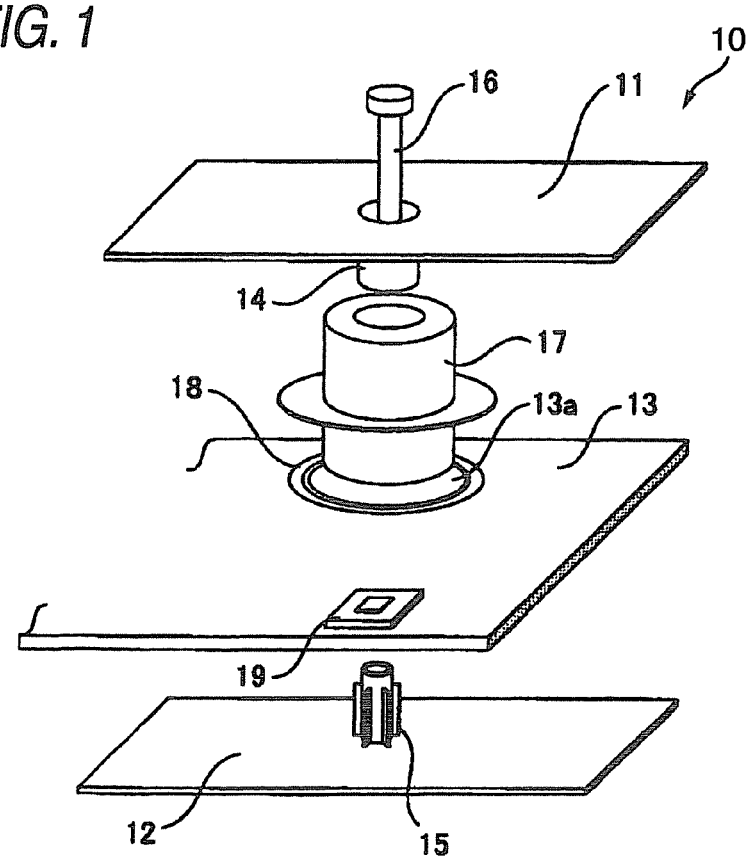
FIG. 1 is an exemplary perspective view schematically showing a supporting structure of a circuit board related to a first embodiment of the invention.

Hereinafter, embodiments of the invention will be described with reference to the drawings. In each of the drawings, the same elements are denoted by the same reference numerals, and duplicate description thereof is omitted.

First Embodiment

Figure 2:
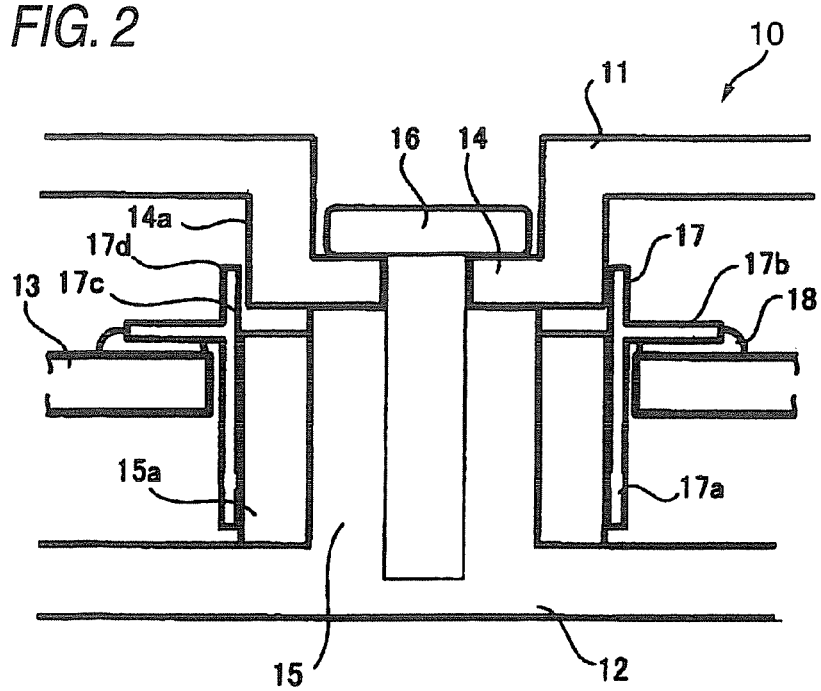
FIG. 2 is an exemplary schematic sectional view of the supporting structure of the circuit board related to the first embodiment.
Figure 3:
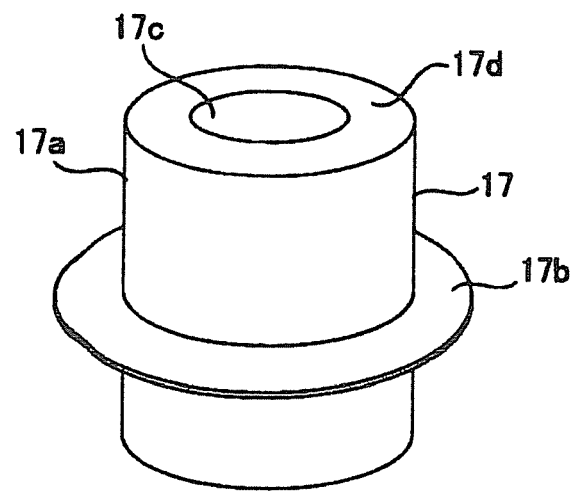
FIG. 3 is an exemplary perspective view of a jig in the supporting structure.
Figure 14:
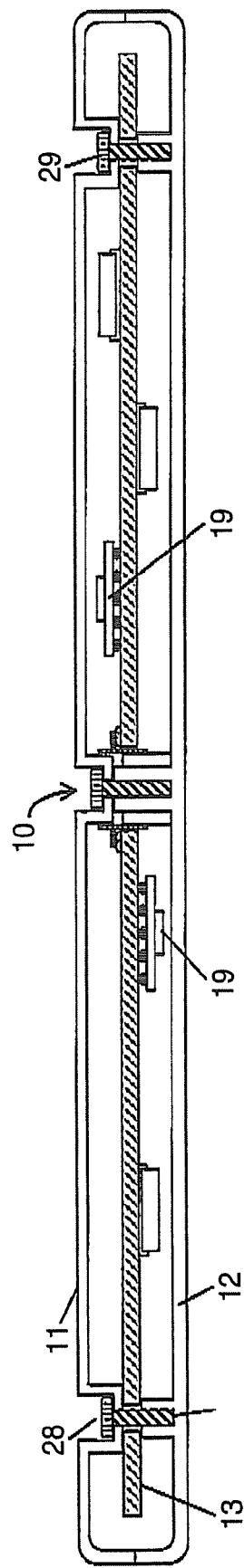
FIG. 14 is an exemplary schematic sectional view showing an electronic apparatus related to the first embodiment.

FIG. 1 is a perspective view schematically showing a supporting structure of a circuit board related to a first embodiment of the invention. FIG. 2 is a schematic sectional view of the supporting structure of the circuit board related to the first embodiment. FIG. 3 is a perspective view of a jig in the supporting structure. Further, FIG. 14 is an exemplary schematic sectional view showing an electronic apparatus related to the first embodiment.

The supporting structure of this circuit board includes an upper casing 11, a lower casing 12, and a jig 17, for housing and holding a circuit board 13 as interposed between the upper casing 11 and the lower casing 12 from the up-down direction. A boss portion 14 is formed in the upper casing 11 toward the circuit board 13. In this embodiment, the boss portion 14 is formed in a shape recessed from the upper casing 11. Moreover, a hole is formed in the recessed portion of the boss portion 14, and a boss screw 16 is inserted through the hole.

Similarly, a boss portion 15 is formed in the lower casing 12 toward the circuit board 13. As shown in FIG. 2, the boss portion 14 of the upper casing 11 and the boss portion 15 of the lower casing 12 face each other. In this embodiment, the boss portion 15 is formed in a shape protruding from the lower casing 12. Moreover, an internal thread into which the boss screw 16 is threadeably inserted from the upper casing 11 is fabricated in the boss portion 15. In addition, reinforcing ribs 15a can be suitably formed at a peripheral wall of the boss portion 15 to increase rigidity.

The jig 17 assumes a cylindrical shape, and the boss portions 14 and 15 are slidably inserted into an inside 17c of a cylindrical portion 17a of the jig 17. A flange portion 17b is formed at an intermediate portion of the cylindrical portion 17a of the jig 17.

A hole 13a of a larger diameter than the external diameter of the cylindrical portion 17a of the jig 17 is formed in the circuit board 13, and the jig 17 is adapted to pass through the hole 13a. A solder joint 18 is provided around the hole 13a of the circuit board 13, and the flange portion 17b of the jig 17, and the circuit board 13 are solder-joined, thereby securing electric conduction. Further, an electronic component 19 is mounted on the circuit board 13. In this embodiment, the jig 17 is mounted by a soldering process similarly to other components.

For example, when an electronic apparatus on which the circuit board 13 is mounted is used at an environmental temperature of 0° C. to 40° C., outer peripheries 14a and 15a of the boss portions 14 and 15, and the inside 17c of the cylindrical portion 17a of the jig 17 are slidable in the fastening direction of the boss portions 14 and 15 within a temperature range of the electronic apparatus.

In addition, as shown in FIG. 14, the circuit board 13 is fixed at both ends thereof. FIG. 14 shows an electronic apparatus related to the first embodiment. The electronic apparatus has the circuit board supporting structure 10.

Since the supporting structure of the circuit board 13 is configured as described above, the circuit board 13 is not fixed at the boss portions 14 and 15, but is slidable in the fastening direction of the boss portions 14 and 15. Therefore, for example, even in a case where the upper casing 11 is pushed, the external load from right above the boss portions 14 and 15 is not applied to the circuit board 13. Accordingly, since the stress by the external load is not concentrated on the peripheries of the boss portions 14 and 15 in the circuit board 13, the load to a joint of the electronic component 19 which exists in the vicinity of the boss portions 14 and 15 can be reduced.

Even in a case where excessive deformation is caused in the upper casing 11 or the lower casing 12 by the external load from right above the boss portions 14 and 15, an end 17d of the cylindrical portion 17a of the jig 17 contacts the upper casing 11 or the lower casing 12. Therefore, the electronic component 19 mounted on the circuit board 13 can be prevented from contacting the upper casing 11.

Further, the inside 17c of the cylindrical portion 17a of the jig 17 generally contacts and faces the whole peripheries of outer peripheral surfaces 14a and 15a of the boss portions 14 and 15 parallel to the fastening direction of the boss portions 14 and 15. Therefore, the force in the in-plane direction of the circuit board 13, and the moment around the in-plane axis thereof can be transmitted. Accordingly, with respect to loads other than the load from right above the boss portions 14 and 15, a load is transmitted to the circuit board 13, thereby increasing the rigidity of the whole casing.

On the other hand, since the jig 17 is fixed to the solder joint 18, a flexible structure is obtained as compared with other parts. Accordingly, even in a case where temperature fluctuation occurs around or inside an electronic apparatus, since any stress is not concentrated on the peripheries of the boss portions 14 and 15 in the circuit board 13, the load to a joint of the electronic component 19 which exists in the vicinity of the boss portions 14 and 15 can be reduced.

Second Embodiment

Figure 4:
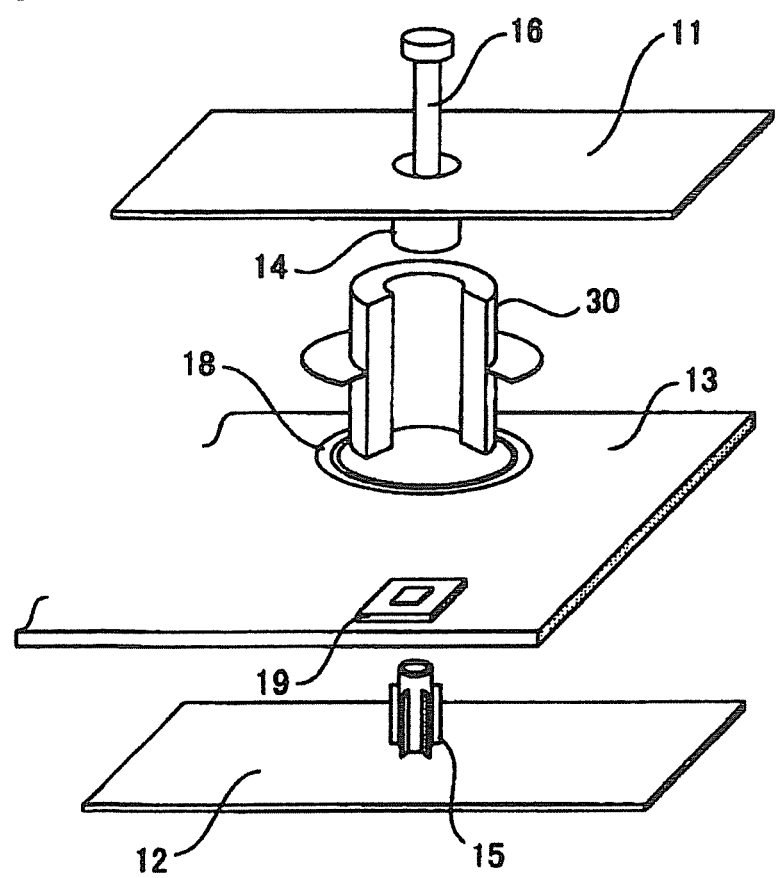
FIG. 4 is an exemplary perspective view schematically showing a supporting structure of a circuit board related to a second embodiment of the invention.
Figure 5:
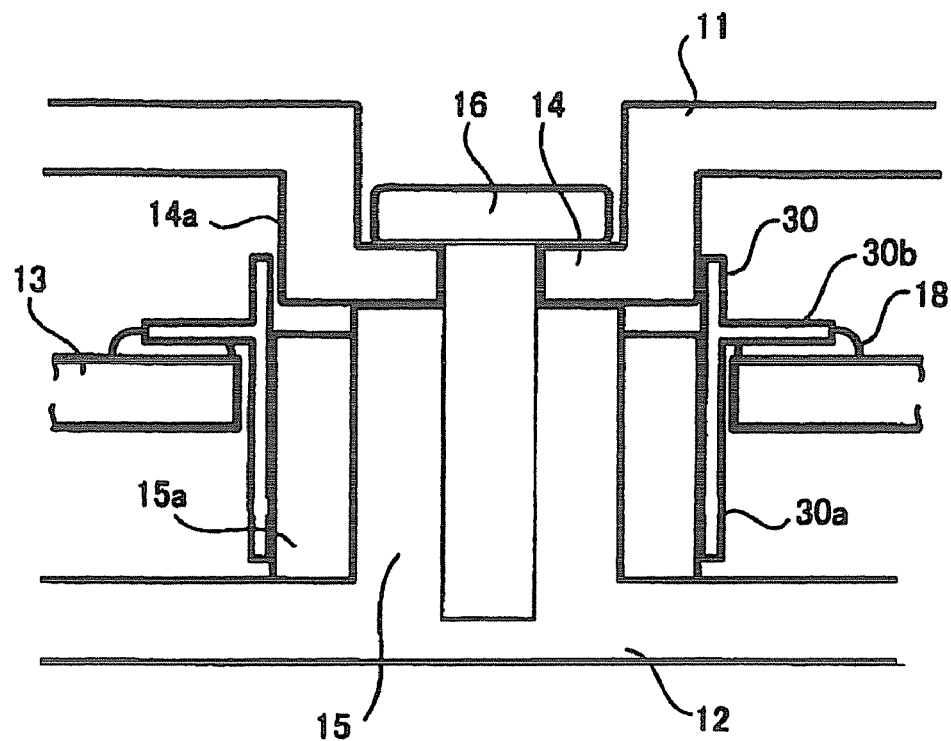
FIG. 5 is an exemplary schematic sectional view of the supporting structure of the circuit board related to the second embodiment.
Figure 6:
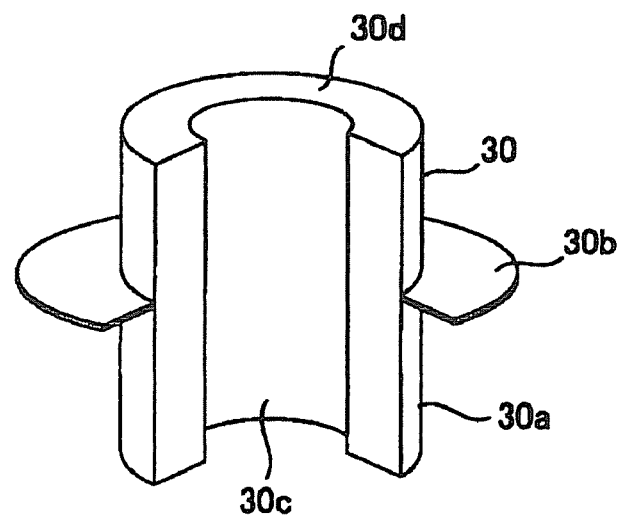
FIG. 6 is an exemplary perspective view of a jig in the supporting structure.

Next, a second embodiment of the invention will be described. FIG. 4 is a perspective view schematically showing a supporting structure of a circuit board related to the second embodiment of the invention. FIG. 5 is a schematic sectional view of the supporting structure of the circuit board related to the second embodiment. Further, FIG. 6 is a perspective view of a jig 30 in the supporting structure.

In this embodiment, configurations other than the jig 30 are the same as those of the first embodiment. As shown in FIG. 4 and FIG. 6, the jig 30 is formed in such a shape that a portion thereof is cut out in a longitudinal direction, unlike the first embodiment.

Even if a cylindrical portion 30a and the flange portion 30b are cut out partially, the same effect as the first embodiment can be exhibited. Further, a sliding surface 30c inside the cylindrical portion 30a a portion of which is cut out generally contacts and faces portions of the outer peripheral surfaces of the boss portions 14 and 15 parallel to the fastening direction of the boss portions 14 and 15. Therefore, since the force in the in-plane direction of the circuit board 13, and the moment around the in-plane axis thereof is transmitted in a direction in which the sliding surface 30c face the peripheral surfaces 14a and 15a of the boss portions, the rigidity of the whole casing is increased. On the other hand, the force in the in-plane direction of the circuit board 13, and the moment around the in-plane axis thereof is transmitted in a direction in which the sliding surface 30c does not face the peripheral surfaces 14a and 15a of the boss portions 14 and 15. Therefore, when the jig 30 is arranged such that the direction in which the electronic component 19 is mounted become the direction in the direction in which the sliding surface does not face the peripheral surfaces 14a and 15a of the boss portions, the load to a joint of the electronic component 19 can be reduced even against loads other than the load from right above the boss portions 14 and 15.

Third Embodiment

Figure 7:
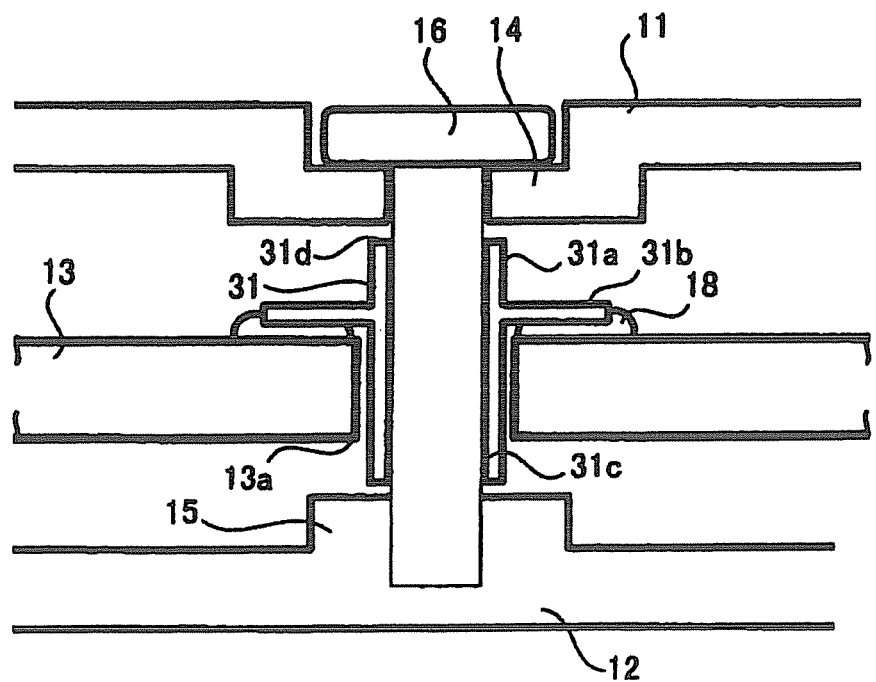
FIG. 7 is an exemplary schematic sectional view of a supporting structure of a circuit board related to a third embodiment of the invention.

Next, a third embodiment of the invention will be described. FIG. 7 is a schematic sectional view of a supporting structure of a circuit board related to the third embodiment of the invention.

The supporting structure of this circuit board generally includes an upper casing 11, a lower casing 12, and a jig 31, for housing and holding the circuit board 13 as interposed between the upper casing 11 and the lower casing 12 from the up-down direction. A boss portion 14 is formed in the upper casing 11 toward the circuit board 13. In this embodiment, the boss portion 14 is formed in a shape recessed from the upper casing 11. Moreover, a hole is formed in the recessed portion of the boss portion 14, and a boss screw 16 is inserted through the hole.

Similarly, a boss portion 15 is formed on the lower casing 12 so as to protrude toward the circuit board 13. As shown in FIG. 7, the boss portion 14 of the upper casing 11 and the boss portion 15 of the lower casing 12 face each other. Moreover, an internal thread into which the boss screw 16 is threadedably inserted from the upper casing 11 is fabricated in the boss portion 15.

The jig 31 assumes a cylindrical shape, and the boss screw 16 is slidably inserted into an inside 31c of a cylindrical portion 31a of the jig 31. A flange portion 31b is formed at an intermediate portion of the jig 31.

A hole 13a of a larger diameter than the external diameter of the cylindrical portion 31a of the jig 31 is formed in the circuit board 13, and the jig 31 is adapted to pass through the hole 13a. A solder joint 18 is provided around the hole 13a of the circuit board 13, and the flange portion 31b of the jig 31, and the circuit board 13 are solder-joined, thereby securing electric conduction. Further, an electronic component 19 is mounted on the circuit board 13.

Since the supporting structure of the circuit board 13 is configured as described above, the circuit board 13 is not fixed at the boss screw 16, but the boss screw 16 and the jig 31 are slidable. Therefore, for example, even in a case where the upper casing 11 is pushed, the external load from right above the boss portions 14 and 15 is not applied to the circuit board 13. Accordingly, since the stress by the external load is not concentrated on the peripheries of the boss portions 14 and 15 in the circuit board 13, the load to a joint of the electronic component 19 which exists in the vicinity of the boss portions 14 and 15 can be reduced.

Even in a case where excessive deformation is caused in the upper casing 11 or the lower casing 12 by the external load from right above the boss portions 14 and 15, an end 31d of the cylindrical portion 31a of the jig 31 contacts THE boss portion 14 or THE boss portion 15. Therefore, the electronic component 19 mounted on the circuit board 13 can be prevented from contacting the upper casing 11.

Further, the inside 31c of the cylindrical portion 31a of the jig 31 generally contacts and faces the whole periphery of an outer peripheral surface of the boss portion 16. Therefore, the force in the in-plane direction of the circuit board 13, and the moment around the in-plane axis thereof can be transmitted. Accordingly, with respect to loads other than the load from right above the boss portions 14 and 15, a load is transmitted to the circuit board 13, thereby increasing the rigidity of the whole casing.

On the other hand, since the jig 31 is fixed to the solder joint 18, a flexible structure is obtained as compared with other parts. Accordingly, even in a case where temperature fluctuation occurs around or inside an electronic apparatus, since any stress is not concentrated on the peripheries of the boss portions 14 and 15 in the circuit board 13, the load to a joint of the electronic component 19 which exists in the vicinity of the boss portions 14 and 15 can be reduced.

Fourth Embodiment

Figure 8:
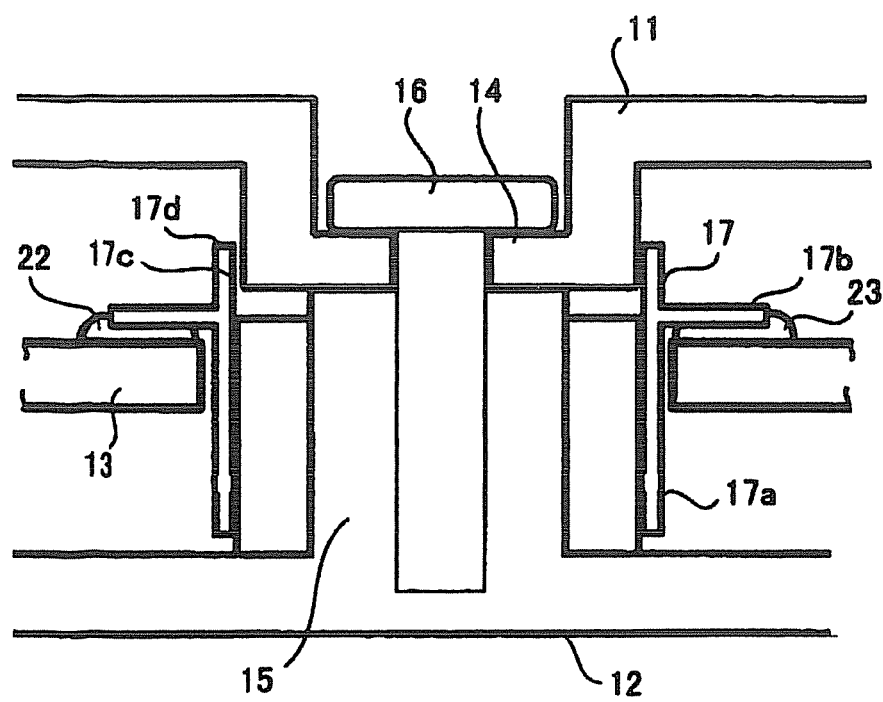
FIG. 8 is an exemplary schematic sectional view of the supporting structure of the circuit board related to a fourth embodiment of the invention.
Figure 9:
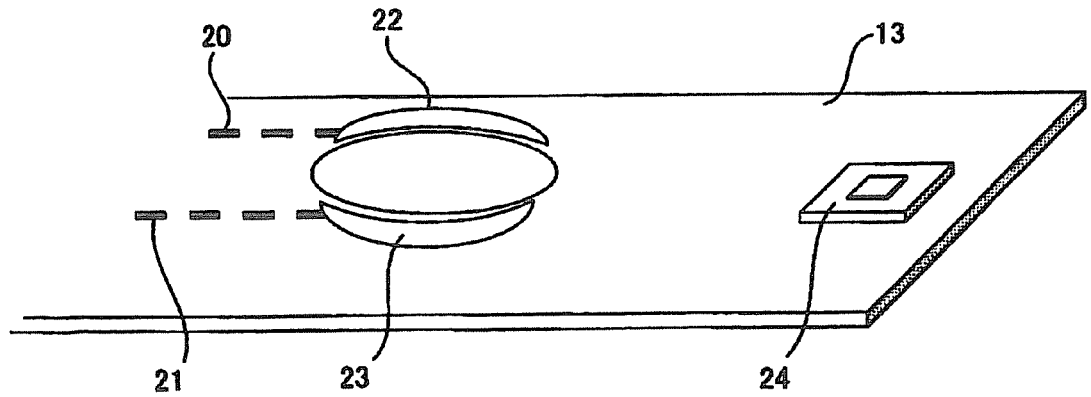
FIG. 9 is an exemplary perspective view showing a circuit board, and wirings on the circuit board.

Next, a fourth embodiment of the invention will be described. FIG. 8 is a schematic sectional view of a supporting structure of a circuit board related to the fourth embodiment. FIG. 9 is a perspective view showing a circuit board, and wirings on the circuit board. In this embodiment, a solder joint includes a first solder joint 22 and a second solder joint 23. The first solder joint 22 and the second solder joint 23 are respectively connected to wirings 20 and 21 formed on the circuit board 13. Although this embodiment differs from the first embodiment in this regard, other configurations are the same as those of the first embodiment. Accordingly, the same effects as those described in the first embodiment can be achieved.

For example, metallic conductors, such as aluminum, are suitable for the jig 17. As shown in FIG. 9, the wiring 20, the first solder joint 22, the jig 37, the second solder joint 23, and the wiring 21 are electrically connected in this order on the circuit board 13, and a circuit network which measures the electric resistance value of this connection path is provided. In addition, it is needless to say that a voltage value or a current value can be measured if necessary.

Normally, the relative displacement of the upper casing 11 or the lower casing 12, and the circuit board 13 resulting from the difference between the coefficients of linear expansion thereof is larger compared with the relative displacement of a semiconductor package 24 and the circuit board 13 resulting from the difference between the coefficients of linear expansion thereof. Accordingly, the distortion caused at the boss portions 14 and 15 at which the upper casing 11 and the lower casing 12 are joined to the circuit board 13 is larger than the distortion caused at the joint of the semiconductor package 24 and the circuit board 13. Since the value obtained by dividing the relative displacement by the height of the joint is an average distortion, in a case where the height of the first solder joint 22 and the second solder joint 23 is equal to or slightly greater than the joint of the semiconductor package 24, a fatigue life slightly shorter than that of the semiconductor package 24 can be set.

Specifically, design can be made as follows.

Generally, for example, resin materials, such as ABS resin, or magnesium alloys, are used as the material for the upper casing 11 or the lower casing 12. The coefficient of linear expansion of the resin casing is 80 ppm/° C., and the coefficient of linear expansion of the magnesium casing is about 26 ppm/° C. For example, in a case where the upper casing 11 and the lower casing 12 are made of resin, the coefficient of linear expansion thereof is about 80 ppm/° C. Further, when the coefficient of linear expansion of the circuit board 13 is set to about 15 ppm/° C., the coefficient of linear expansion of the semiconductor package 24 is set to about 13 ppm/° C., the temperature range of fluctuation inside a casing is set to 20° C., the distance between the boss portions in a plane is set to 150 mm, and the size of an electronic component is set to 35 mm×35 mm, the expansion difference between the upper casing 11 or the lower casing 12, and the circuit board 13 becomes about 0.2 mm, the expansion difference between the semiconductor package 24 and the circuit board 13 is set to about 0.002 mm.

As such, it is provided that the relative displacement of the upper casing 11 or the lower casing 12, and the circuit board 13 resulting from the difference between the coefficients of linear expansion thereof is larger compared with the relative displacement of the semiconductor package 24 and the circuit board 13 resulting from the difference between the coefficients of linear expansion thereof.

Accordingly, before the joint of the semiconductor package 24 is ruptured, the first solder joint 22 or the second solder joint 23 is ruptured and an electric resistance value rises. As a result, it can be detected in advance that rupture of the joint of the semiconductor package 24 on the circuit board 13 is approaching.

Fifth Embodiment

Figure 10A:
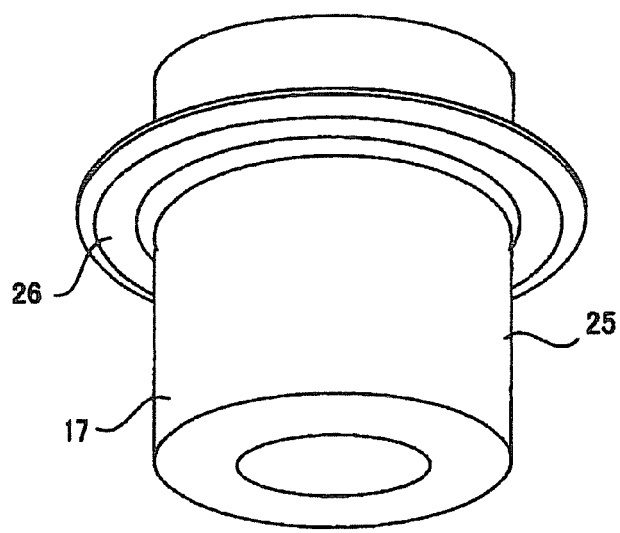
FIGS. 10A and 10B are another exemplary perspective view of a jig in the supporting structure.
Figure 10B:

Next, a fifth embodiment of the invention will be described. FIG. 10A is a perspective view of a jig in the supporting structure, and FIG. 10B is a perspective view of a portion of the jig.

In this embodiment, the jig 17 is configured of a resinous portion 25, and a portion 26 made of, for example, metal, such as aluminum. The other configurations are the same as those of the above-described fourth embodiment. Accordingly, the same effects as those described in the fourth embodiment can be achieved.

The resinous portion 25 of the jig 17 is outsert-molded so as to be attached and fixed to the metallic portion 26. Similarly to that shown in FIG. 9, the wiring 20, the first solder joint 22, the metallic portion 26 of the jig 17, the second solder joint 23, and the wiring 21 are electrically connected in this order on the circuit board 13, and forms a circuit network which measures the electric resistance value of this connection path. In addition, it is needless to say that a voltage value or a current value can be measured.

According to this embodiment, since most of the jig 17 is the resinous portion 25, light-weight and easy molding can be achieved.

Sixth Embodiment

Figure 11:
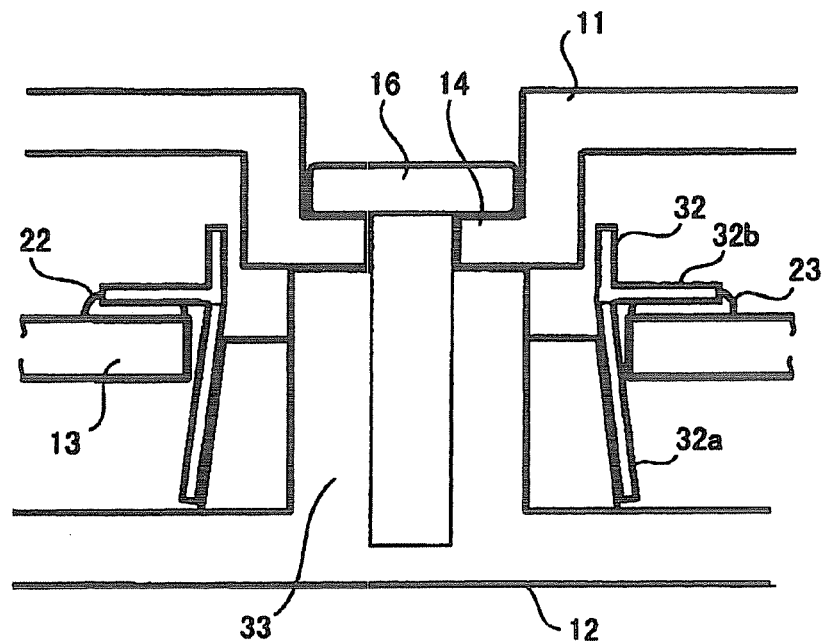
FIG. 11 is an exemplary schematic sectional view of a supporting structure of a circuit board related to a sixth embodiment of the invention.
Figure 12:
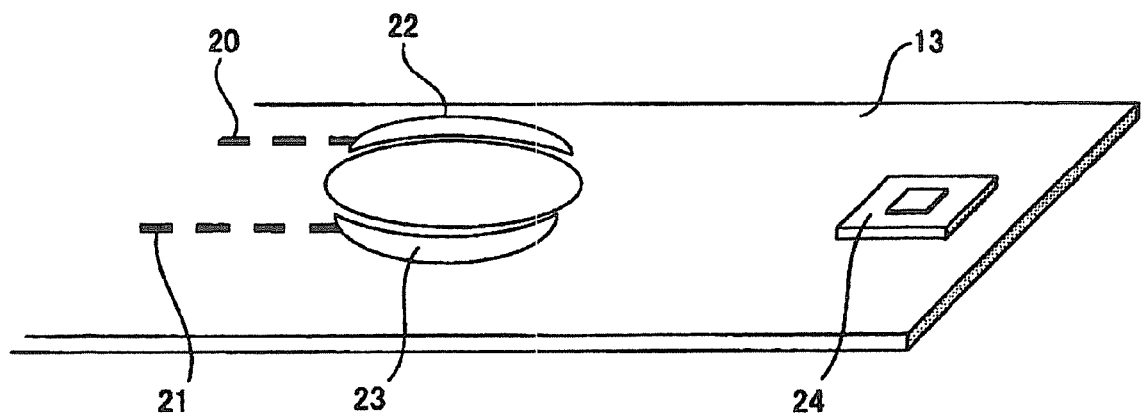
FIG. 12 is another exemplary perspective view showing a circuit board, and wirings on the circuit board.
Figure 13:
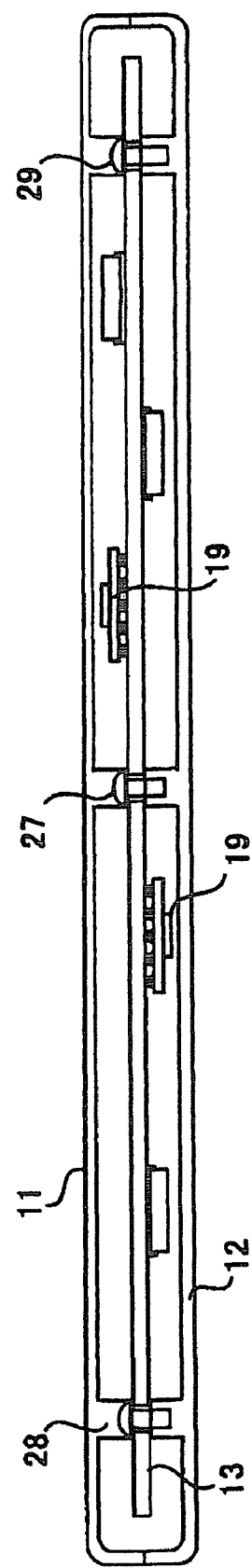
FIG. 13 is an exemplary schematic sectional view showing a support state of a circuit board in the related electronic apparatus.

Next, a sixth embodiment of the invention will be described. FIG. 11 is a schematic sectional view of a supporting structure of a circuit board related to the sixth embodiment. FIG. 12 is a perspective view showing a circuit board, and wirings on the circuit board.

As shown in FIG. 11, the jig 32 has a taper 32a, and a boss portion 33 of the lower casing also has a taper such that its diameter becomes smaller toward the boss portion 14 of the upper casing. In this embodiment, the shapes of the jig 32 and the boss portion 33 of the lower casing differ from those of the above-described fourth embodiment. The other configurations are the same as those of the fourth embodiment. Accordingly, the same effects as those described in the fourth embodiment can be achieved.

When the relative displacement of the upper casing 11 or the lower casing 12 and the circuit board 13 resulting from the difference between the coefficients of linear expansion thereof is caused by temperature fluctuation, the jig 32 contacts the boss portion 33 of the lower casing, and the force in the direction in which the flange portion 32b of the jig 32 is separated from the circuit board 13 act on the jig 32 by the taper. Therefore, the force in the direction of tension acts on the first solder joint 22 or the second solder joint 23. Even if the first solder joint 22 or the second solder joint 23 is ruptured, since electrical connection is made when the ruptured surfaces partially contact each other, an electric resistance value may not change. However, in this embodiment, the force in the direction of tension acts on the first solder joint 22 or the second solder joint 23. Therefore, even if the first solder joint 22 or the second solder joint 23 is ruptured, the phenomenon that an electric resistance value does not change can be prevented.

It is to be understood that the present invention is not limited to the specific embodiments described above and that the present invention can be embodied with the components modified without departing from the spirit and scope of the present invention. The present invention can be embodied in various forms according to appropriate combinations of the components disclosed in the embodiments described above. For example, some components maybe deleted from the configurations as described as the embodiments. Further, the components in different embodiments may be used appropriately in combination.

What is claimed is:

1. An electronic apparatus having a circuit board supporting structure, the circuit board supporting structure comprising:
   a casing including a first body and a second body, the first body having a first boss portion, the second body having a second boss portion;
   a jig including a cylindrical portion having an inner peripheral wall, and a flange portion formed on an outer periphery, the cylindrical portion configured to slidably receive the first boss portion and the second boss portion in the inner peripheral wall; and
   a circuit board disposed in the casing, wherein:
   the first boss portion and the second boss portion are configured to be fastened by a bolt member;
   the circuit board has a hole and a joining region provided around the hole, the hole configured to allow the cylindrical portion to penetrate therethrough; and
   the joining region is configured to be soldered to the flange portion.

2. The apparatus of claim 1,
   wherein the second boss portion has a rib formed on an outer periphery thereof, and
   the rib is configured to be slidable on the inner peripheral wall.

3. The apparatus of claim 1,
   wherein a gap between the first body and the second body is larger than a length of the cylindrical portion.

4. The apparatus of claim 1,
   wherein the cylindrical portion has a cutout portion in a longitudinal direction of the cylindrical portion.

5. An electronic apparatus having a circuit board supporting structure, the circuit board supporting structure comprising:
   a casing including a first body and a second body, the first body having a first boss portion, the second body having a second boss portion;
   a bolt member configured to fasten the first and second boss portions;
   a jig including a cylindrical portion having an inner peripheral wall, and a flange portion formed on an outer periphery, the cylindrical portion configured to slidably receive the first boss portion and the second boss portion in the inner peripheral wall; and
   a circuit board disposed in the casing, wherein:
   the circuit board has a hole and a joining region provided around the hole, the hole configured to allow the cylindrical portion to penetrate therethrough; and
   the joining region is configured to be soldered to the flange portion.

6. The apparatus of claim 1, wherein the circuit board supporting structure further comprises:
   a first wiring formed on the circuit board;
   a second wiring formed on the circuit board; and
   a circuit network, wherein:
   the joining region includes a first solder joint and a second solder joint separated from the first solder joint, the first solder joint configured to electrically connect with the first wiring, the second solder joint configured to electrically connect with the second wiring;

the jig has a conductive portion configured to electrically connect the first solder joint and the second solder joint; and the circuit network electrically connects with the first wiring and the second wiring to measure an electrical characteristic value of the first solder joint or the second solder joint.

7. The apparatus of claim 5, wherein the circuit board supporting structure further comprises:

a first wiring formed on the circuit board;
a second wiring formed on the circuit board; and
a circuit network, wherein:
the joining region includes a first solder joint and a second solder joint separated from the first solder joint, the first solder joint configured to electrically connect with the first wiring, the second solder joint configured to electrically connect with the second wiring;

the jig has a conductive portion configured to electrically connect the first solder joint and the second solder joint; and the circuit network electrically connects with the first wiring and the second wiring to measure an electrical characteristic value of the first solder joint or the second solder joint.

8. The apparatus of claim 6,
wherein the electrical characteristic value includes at least one of a resistance value, a voltage value, and a current value.

9. The apparatus of claim 7,
wherein the electrical characteristic value includes at least one of a resistance value, a voltage value, and a current value.

* * * * *